(12) United States Patent
Hachuda (10) Patent No.: US 9,859,641 B2
(45) Date of Patent: Jan. 2, 2018

(54) SOCKET FOR ELECTRICAL COMPONENT (71) Applicant: ENPLAS CORPORATION, Kawaguchi-shi, Saitama (JP)

(72) Inventor: Osamu Hachuda, Kawaguchi (JP)

(73) Assignee: ENPLAS CORPORATION, Kawaguchi (JP)

(*) Notice: Subject to any disclaimer, the term of this patent is extended or adjusted under 35 U.S.C. 154(b) by 0 days.

(21) Appl. No.: 15/300,612

(22) PCT Filed: Mar. 27, 2015

(86) PCT No.: PCT/JP2015/059574
§ 371 (c)(1),
(2) Date: Sep. 29, 2016

(87) PCT Pub. No.: WO2015/152034
PCT Pub. Date: Oct. 8, 2015

(65) Prior Publication Data
US 2017/0117652 A1    Apr. 27, 2017

(30) Foreign Application Priority Data
Mar. 31, 2014    (JP) .................................. 2014-071609

(51) Int. Cl.
*H01R 13/629* (2006.01)
*H01R 13/11* (2006.01)
(Continued)

(52) U.S. Cl.
CPC .......... *H01R 13/11* (2013.01); *H01L 23/4012* (2013.01); *H01R 13/50* (2013.01); *H01R 13/62922* (2013.01); *H01R 13/62938* (2013.01)

(58) Field of Classification Search
CPC  H01R 13/62; H01R 13/629; H01R 13/62905; H01R 13/62922;
(Continued)

(56) References Cited

U.S. PATENT DOCUMENTS 7,651,340 B2 * 1/2010 Barabi ................. G01R 1/0466
439/73
2005/0231919 A1   10/2005 Ujike et al.

FOREIGN PATENT DOCUMENTS

JP        6-310232         11/1994
JP        2001-281295      10/2001
(Continued)

OTHER PUBLICATIONS

International Search report dated May 26, 2015, in corresponding International Application No. PCT/JP2015/059574.

*Primary Examiner* — Felix O Figueroa
(74) *Attorney, Agent, or Firm* — Staas & Halsey LLP (57) ABSTRACT

The present invention aims to improve heat dissipation effect for an electrical component in a socket for electrical component in which a socket body and a cover member are separated. According to an embodiment, a cover member includes a frame-like cover body including an opening in a middle portion thereof, a heatsink provided to penetrate through the opening of the frame-like cover body, an elevating part supporting the heatsink, and a pressing part that is moveable to press the elevating part so as to press the heatsink against the electrical component. While the heatsink is pressed against the electrical component, the electrical component is fixed to the housing portion of the socket body. Accordingly, it is possible to make the heatsink perform heat dissipation for the electrical component. Thus, it is possible to obtain excellent heat dissipation effect with respect to the electrical component.

5 Claims, 11 Drawing Sheets

(51) Int. Cl.
*H01L 23/40* (2006.01)
*H01R 13/50* (2006.01)

(58) Field of Classification Search
CPC ........ H01R 13/62933; H01R 13/62938; H01R 13/62966; H01R 13/62972; H01R 13/62977
USPC .................................................. 439/73, 331
See application file for complete search history.

(56) References Cited

FOREIGN PATENT DOCUMENTS

| | | |
|---|---|---|
| JP | 2004-63919 | 2/2004 |
| JP | 2005-327702 | 11/2005 |
| JP | 2006-252946 | 9/2006 |

\* cited by examiner

SOCKET FOR ELECTRICAL COMPONENT

CROSS REFERENCE TO THE RELATED APPLICATION

This application is a U.S. national stage application, which claims the benefit under 35 USC §371 of PCT International Patent Application No. PCT/JP2015/059574 filed Mar. 27, 2015 which claims foreign priority benefit under 35 USC §119 of Japanese patent application No. 2014-071609, filed Mar. 31, 2014, the contents of which are herein incorporated by reference.

TECHNICAL FIELD

The present invention relates to a socket for electrical component housing an electrical component such as a semiconductor device (hereinafter referred to as an "IC package").

BACKGROUND ART

Conventionally, as a "socket for electrical component", a socket is known that houses an electrical component such as a semiconductor device (hereinafter referred to as an "IC package"). As this type of socket for electrical component, there is an IC socket in which a socket body and a cover unit are completely separated, as described in, for example, Japanese Patent Laid-Open No. 2006-252946.

In the IC socket of Japanese Patent Laid-Open No. 2006-252946, as shown in FIG. 5 thereof, an IC package is housed in the socket body, and a push-fit cover unit is set to an upper surface thereof.

Further, a claw of a latch provided to this push-fit cover unit is engaged with the socket body. On this occasion, this latch is biased in the closing direction by a coil spring, such that this push-fit cover unit is held by the socket body.

Then, a push-fit member provided to this push-fit cover unit is made to abut against the upper surface of the IC package, and an adjusting knob provided in a middle portion of this push-fit cover unit is rotated in a horizontal direction so as to press this push-fit member, thereby fixing this IC package.

In this manner, it is possible to fix this IC package with an appropriate pressing force.

SUMMARY OF INVENTION

Technical Problem

However, in such a conventional socket, for example, when conducting an operation test etc. of an IC package, it was difficult to efficiently dissipate heat generated in this IC package.

Accordingly, an object of the present invention is to provide a socket for electrical component with excellent heat dissipation effect.

Solution to Problem

In order to achieve the object, the present invention provides a socket for electrical component, including: a socket body in which an electrical component is housed in a housing portion provided in an upper surface side, and a contact pin to be electrically connected to the electrical component is provided; and a cover member removably provided to the socket body and covering the housing portion of the socket body, in which the cover member includes: a frame-like cover body that is placed on an upper side outer edge portion of the socket body and includes an opening in a middle portion in up and down directions; a heatsink that is provided to penetrate through the opening of the cover body and performs heat dissipation for the electrical component; and a pressing part that is supported by the cover body and moves down the heatsink so as to press the heatsink against the electrical component.

In the present invention, desirably, the pressing part includes a pair of pressing mechanisms and a horizontal bar, the pair of pressing mechanisms are provided to a pair of opposing sides of the cover body, respectively, and move down the heatsink so as to press the heatsink against the electrical component, and the horizontal bar connects the pair of pressing mechanisms to each other.

In the present invention, desirably, an elevating part is provided to the cover body such that the elevating part can be moved up and down, and the heatsink is supported by the elevating part such that the heatsink can be moved up and down, and the heat sink is moved down by moving down the elevating part.

In the present invention, desirably, the elevating part is biased upwardly by a first spring provided to the cover body, and the heatsink is biased downwardly by a second spring provided to the elevating part.

Advantageous Effects of Invention

According to the present invention, by pressing the heatsink against the electrical component with the use of the pressing part, the electrical component is fixed to the housing portion of the socket body. Accordingly, it is possible to make the heatsink perform heat dissipation for the electrical component. Thus, it is possible to obtain excellent heat dissipation effect with respect to the electrical component.

In the present invention, the heatsink is arranged in the middle portion, and the pressing part is arranged on both sides thereof. Thus, it is possible to increase the size of the heatsink, and thus to improve the heat dissipation. Additionally, by connecting the pair of pressing mechanisms to each other by the horizontal bar, it is possible to perform pressing and releasing of the pressing of the electrical component with the heatsink by operating the horizontal bar. Thus, even though the heatsink is arranged in the cover body to penetrate therethrough, the operations of pressing and releasing of the pressing are easy.

In the present invention, by supporting the heatsink by the elevating part and moving down the elevating part by the pressing part, it is possible to press the heatsink against the electrical component.

In the present invention, the pressing part is biased upwardly by a first spring provided to the cover body, and the heatsink is biased downwardly by a second spring provided to the pressing part. Accordingly, it is possible to appropriately set the pressing force of the heatsink with respect to the electrical component.

DESCRIPTION OF EMBODIMENTS

Embodiment 1 of the Present Invention

Hereinbelow, a description is given of an embodiment 1 of the present invention with reference to FIGS. 1 to 7.

Figure 1:
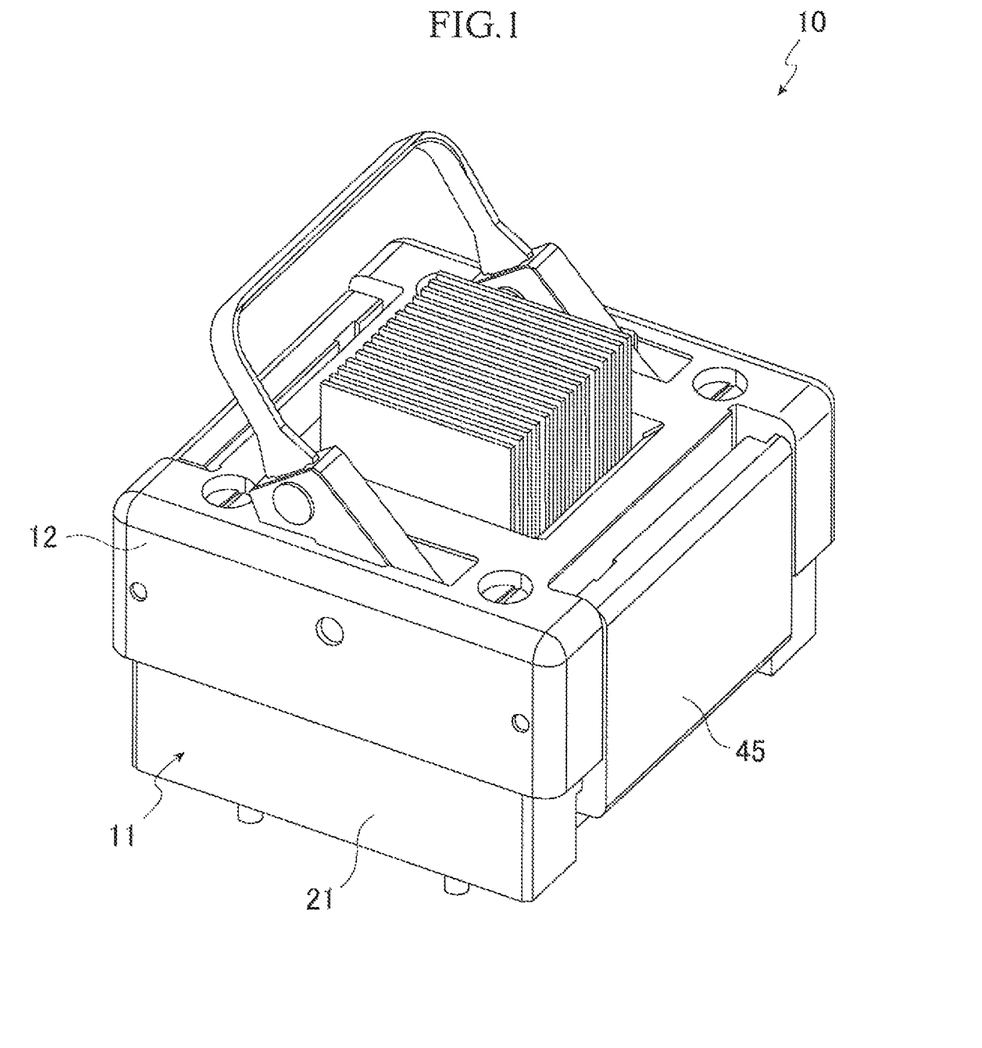
FIG. 1 is a perspective view showing the general configuration of a socket for electrical component in accordance with an embodiment 1 of the present invention.

As shown in FIG. 1 etc., an IC socket 10 as a "socket for electrical component" includes a socket body 11 and a cover member 12.

Figure 2:
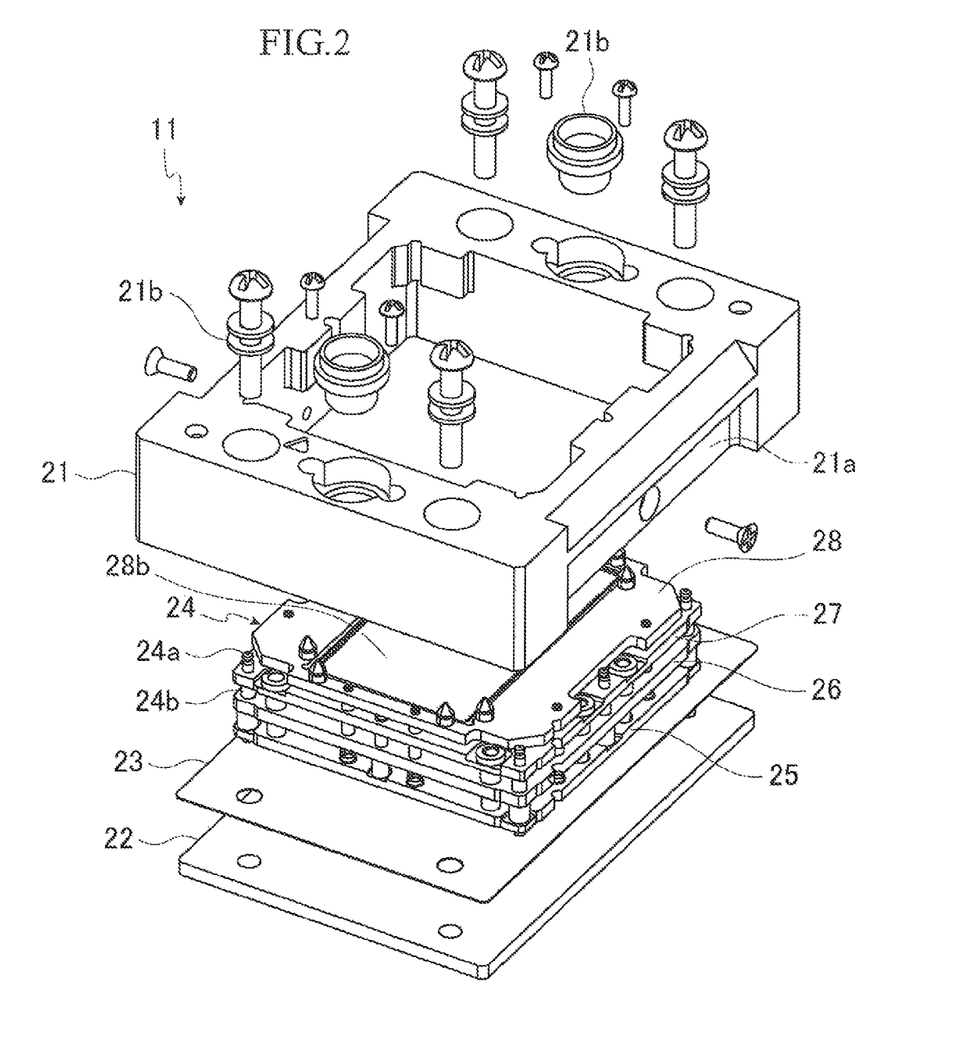
FIG. 2 is an exploded perspective view showing the configuration of a socket body of the socket for electrical component in accordance with the embodiment 1.

The socket body 11 includes, as shown in FIG. 2, a frame-shaped base part 21, a bottom plate 22 covering a bottom surface of this base part 21, an insulating plate 23 provided on an upper surface of this bottom plate 22, and a contact module 24 provided on this insulating plate 23 and housed in the base part 21.

On both left and right side surfaces of the base part 21, a pair of engaging concave portions 21a are formed to be engaged with engaging claws 45d, which are provided in bottom end portions of latches 45 described later, for fixing the socket body 11 and the cover member 12. In addition, in the vicinity of both front and back side surfaces of the base part 21, bushings 21b are provided for positioning the cover member 12 at the time of installation.

Figure 3:
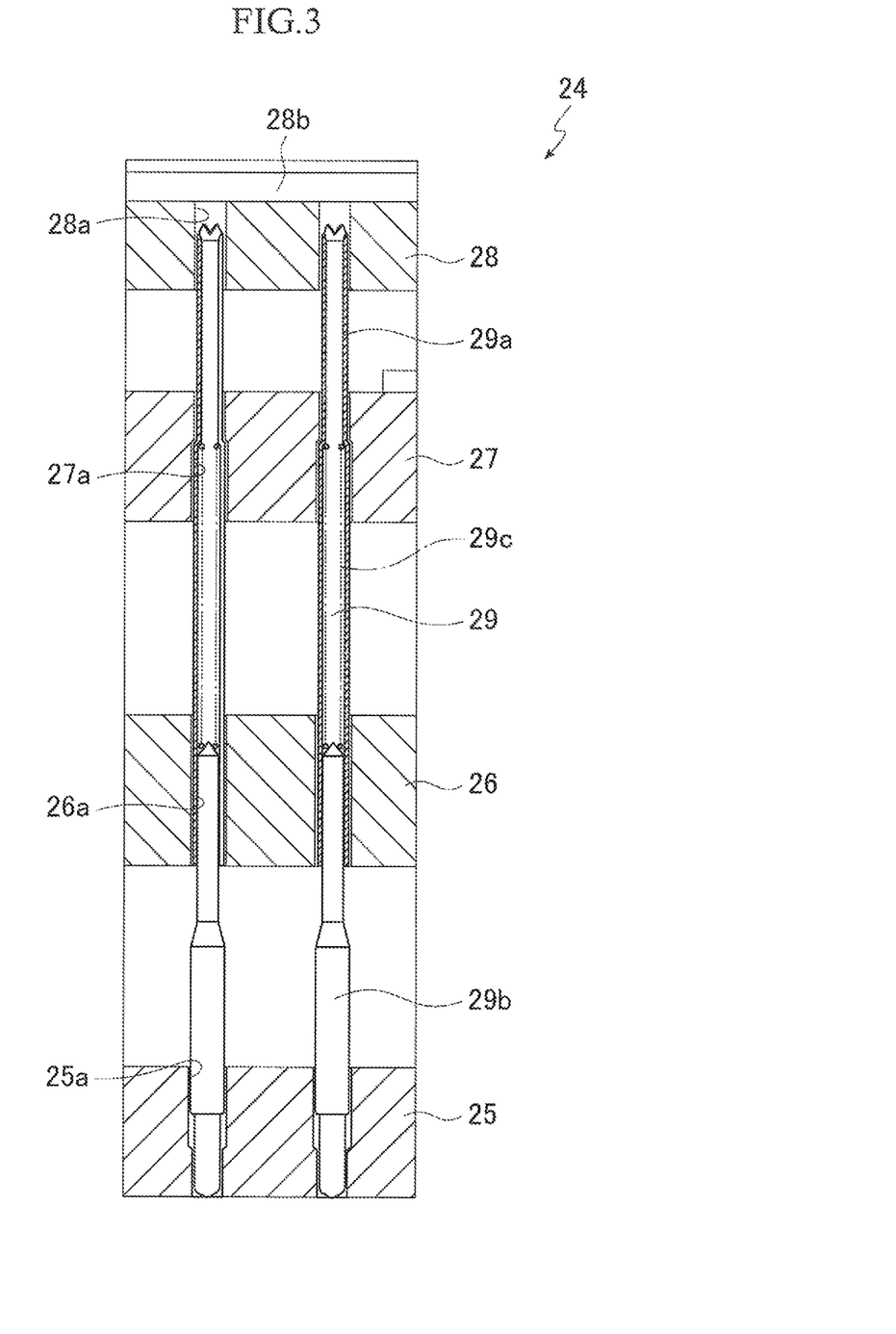
FIG. 3 is a cross-sectional view showing the configuration of a contact module of the socket for electrical component in accordance with the embodiment 1.

Additionally, in the contact module 24, as shown in FIGS. 2 and 3, a first plate 25, a second plate 26, a third plate 27 and a fourth plate (floating plate) 28 are arranged in this order from the bottom, and are fixed apart from each other by using screws 24a and spacers 24b.

Then, in each of these plates 25 to 28, respective through-holes 25a to 28a for housing contact pins 29 are formed.

Figure 7A:
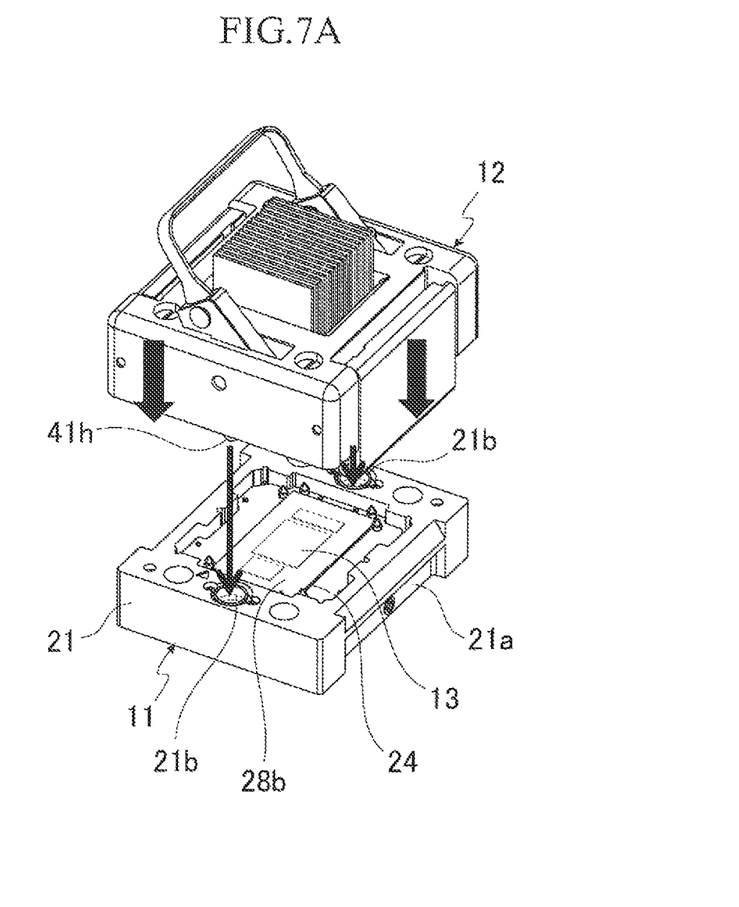
FIG. 7A is a perspective view for explaining a usage method of the socket for electrical component in accordance with the embodiment 1.
Figure 7B:
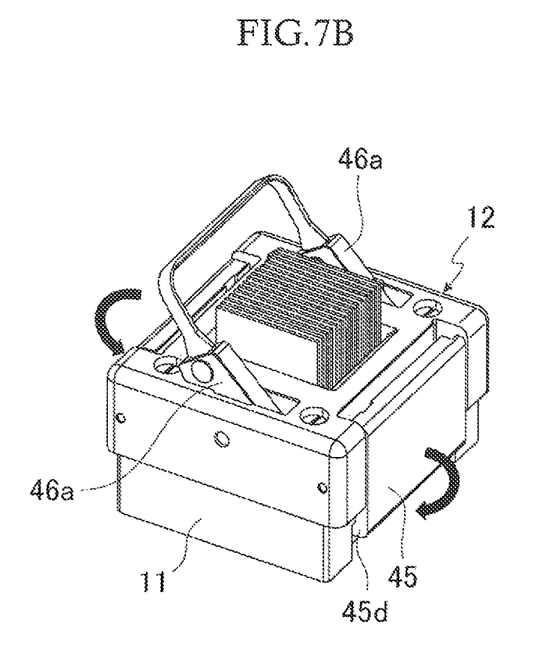
FIG. 7B is a perspective view for explaining the usage method of the socket for electrical component in accordance with the embodiment 1.
Figure 7C:
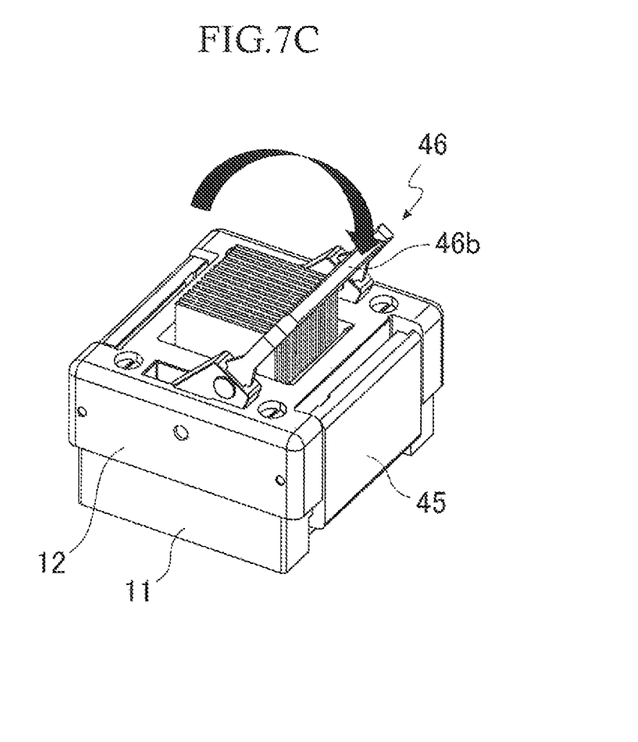
FIG. 7C is a perspective view for explaining the usage method of the socket for electrical component in accordance with the embodiment 1.

In addition, a housing portion 28b for housing an IC package 13 (see FIG. 7 described later) as an "electrical component" is provided in an upper surface of the topmost fourth plate 28. When the IC package 13 is housed in the housing portion 28b, each electrode terminal provided on a bottom surface of the IC package 13 is inserted into the through-hole 28a, and contacts the contact pin 29.

The contact pin 29 includes, as shown in FIG. 3, a conductive stepped cylindrical upper plunger 29a, a conductive stepped round bar-like lower plunger 29b, and a coil spring 29c. Then, the upper plunger 29a is made to contact with a spherical terminal (not shown) of the IC package 13, and the lower plunger 29b is made to contact with a wiring substrate (not shown), and further, these upper plunger 29a and lower plunger 29b are biased in mutually separating directions by the coil spring 29c, thereby electrically connecting the IC package 13 to the wiring substrate.

On the other hand, the cover member 12 includes, as shown in FIGS. 1, 4, 5 and 6A to 6C, a frame-like cover body 41 that is placed on the base part 21 of the socket body 11 and includes an opening in a middle portion in the up and down directions. On both left and ride side surfaces of the cover body 41, there are provided latch attaching dents 41a for fitting thereto top end portions 45a of the latches 45 (described later), and on both sides of the latch attaching dent 41a, there are provided shaft holes 41b for inserting therein a latch shaft 45b of the latch 45. Further, this cover body 41 is provided with screw holes 41e for inserting therein screws 41c for holding an elevating part 43 (described later) via springs 41d serving as "first springs" of the present invention. Additionally, on end portions of these latch attaching dents 41a, there are provided vertically elongated holes 41i (see FIGS. 6A to 6C) for inserting therein latch locking parts 43b (described later). In addition, on an upper surface side in the vicinity of both front and back side surfaces of the cover body 41, there are provided pressing part insertion holes 41f for inserting therein a pressing part 46 (described later), and camshaft holes 41g for rotatably supporting this pressing part 46 with camshafts 46g. Then, on a lower surface side in the vicinity of both front and back side surfaces of the cover body 41, there are provided guide pins 41h for positioning for setting the cover member 12 to the socket body 11.

Figure 4:
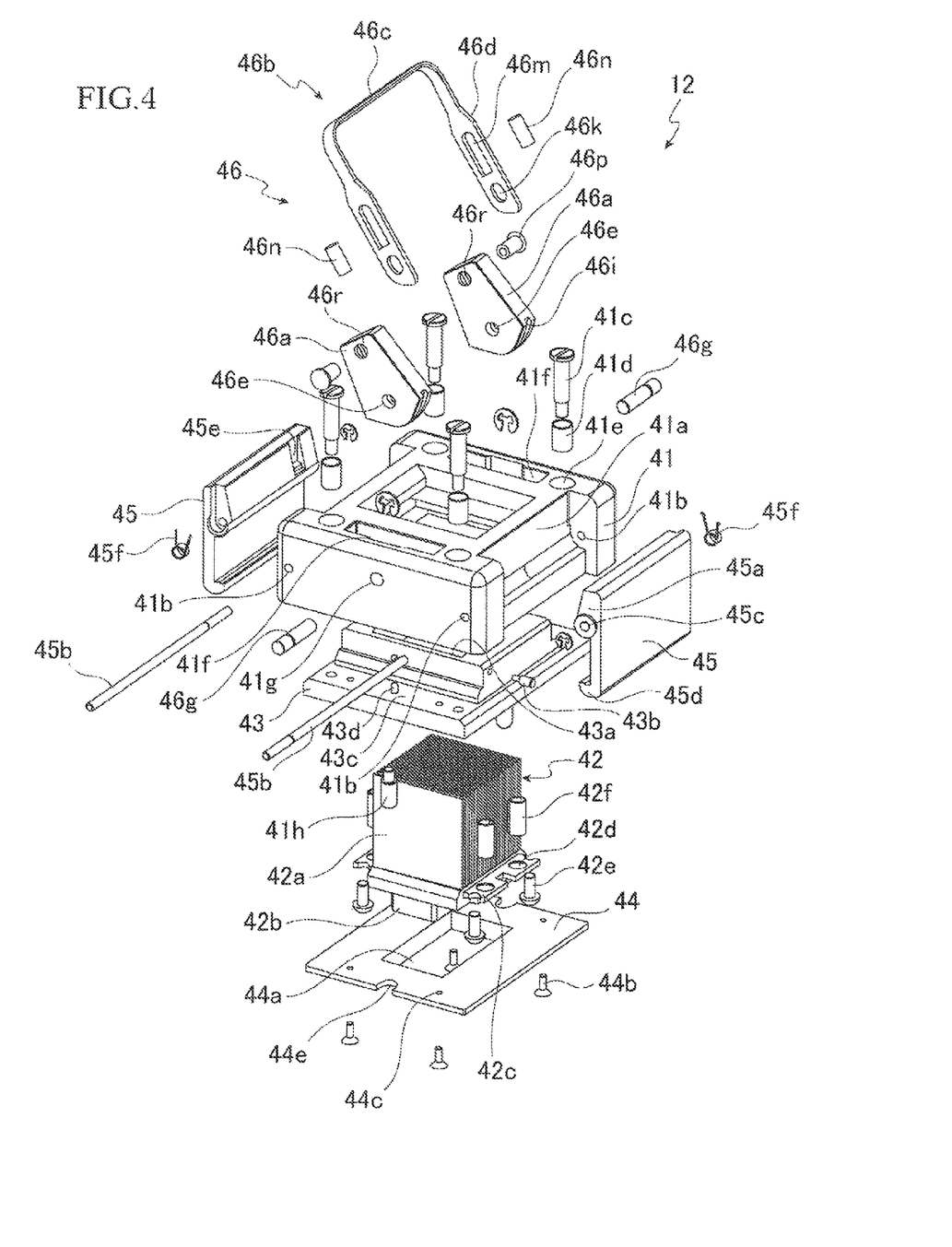
FIG. 4 is an exploded perspective view showing the configuration of a cover member of the socket for electrical component in accordance with the embodiment 1.
Figure 5:
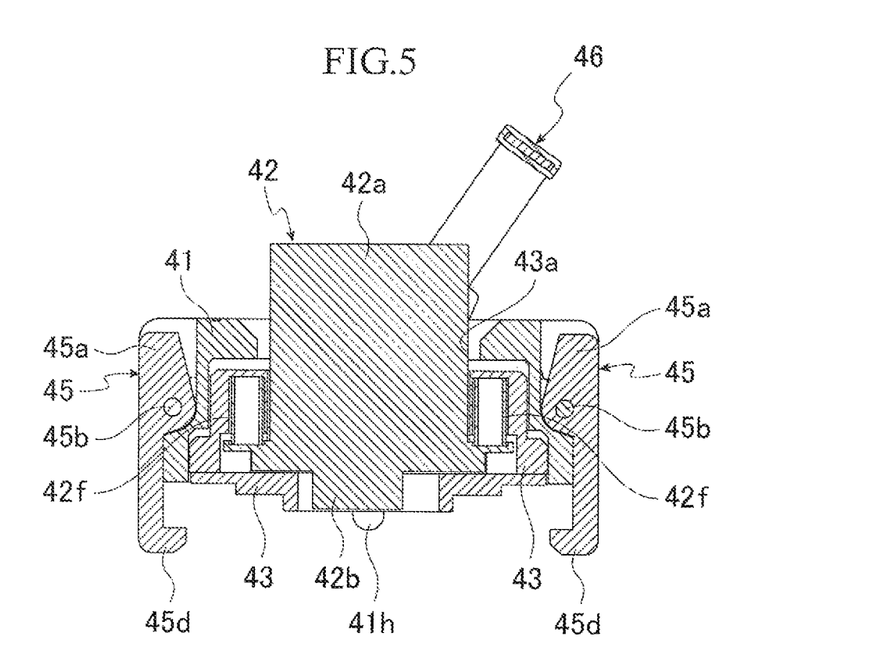
FIG. 5 is a cross-sectional view showing the configuration of the cover member of the socket for electrical component in accordance with the embodiment 1.

Additionally, the cover member 12 includes, as shown in FIG. 4, a heatsink 42 for fixing and performing heat dissipation for the IC package 13, the elevating part 43 for moving up and down the heatsink 42, and a back plate 44 for attaching the heatsink 42 to the elevating part 43.

On both left and right side surfaces of the heatsink 42, there are provided flange parts 42c extending toward an outer circumference direction, and each of the left and right flange parts 42c is provided with two recesses 42d. Springs 42f serving as "second springs" of the present invention are fit into the recesses 42d. Additionally, screws 42e are screwed into screw holes (not shown) of the elevating part 43 via notches of the flange parts 42c, so as to fasten and fix the heatsink 42 to the elevating part 43.

The elevating part 43 is, as shown in FIG. 4, formed into a frame-like shape provided with an opening 43a in a middle portion in the up and down directions, and an upper portion 42a of the heatsink 42 is fit into this opening 43a. In addition, on both left and right side surfaces of the elevating part 43, there are provided the latch locking parts 43b (described later) by using, for example, a screw etc. Further, on a pressed surface 43c of the elevating part 43, there is provided cam locking parts 43d protruding therefrom for preventing the rotation of the pressing part 46 (described later) in the opposite direction.

Additionally, as shown in FIG. 4, the back plate 44 is also provided with an opening 44a in a middle portion in the up and down directions, and a lower portion 42b of the heatsink 42 is fit into this opening 44a. Further, the back plate 44 is provided with insertion holes 44c for inserting therein screws 44b, and notches 44e for positioning the back plate 44 by using the guide pins 41h.

Then, in a state where the lower portion 42b of the heatsink 42 is fit into the back plate 44, positioning is performed with the guide pins 41h, and fastening and fixing to a bottom surface of the elevating part 43 is performed by inserting the screws 44b into the insertion holes 44c from the down direction.

As shown in FIG. 4, the top end portions 45a of the latches 45 are fit into the latch attaching dents 41a of the cover body 41. A shaft hole 45c for inserting therein the latch shaft 45b is formed in the top end portion 45a of the latch 45, such that the shaft hole 45c penetrates therethrough in the front-back direction. Then, by inserting the latch shaft 45b into the shaft hole 45c of the latch 45 and shaft holes 41b of the cover body 41, the latch 45 is rotatably supported by the cover body 41. Additionally, a latch spring 45f for biasing the latch 45 in a closing direction is attached to each of the latch attaching dents 41a.

Here, when the latches 45 are rotated in the closing direction, it is possible to fix the cover member 12 to the socket body 11 by engaging the engaging claws 45d provided to the bottom end portions of the latches 45 with the engaging concave portions 21a (see FIG. 2) of the socket body 11. On the other hand, when the latches 45 are rotated in an opening direction, it is possible to remove the cover member 12 from the socket body 11 by releasing the engagement between the engaging claws 45d and the engaging concave portions 21a.

Figure 6A:
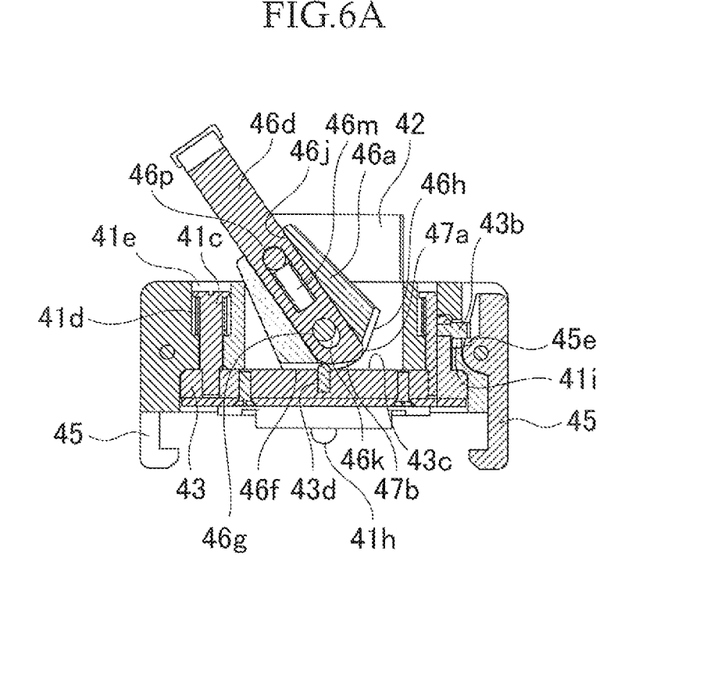
FIG. 6A is a cross-sectional view showing the configurations of an elevating mechanism and a latch mechanism of the socket for electrical component in accordance with the embodiment 1.

In addition, as shown in FIGS. 4 and 6A, on the top end portions 45a of the latches 45, there are provided locking concave portions 45e to be engaged with the latch locking parts 43b of the elevating part 43. As described later, when the elevating part 43 is moved down with the latches 45 closed, the latch locking parts 43b move down within the elongated holes 41i of the cover body 41 to be engaged with the locking concave portions 45e. Consequently, the rotation in the opening direction of the latches 45 is regulated, and locking is made in the closed state.

Additionally, as shown in FIG. 4, the pressing part 46 is attached to the cover body 41. As described later, by rotating this pressing part 46, it is possible to press and move down the elevating part 43 to be pressed against an upper surface of the IC package 13.

The pressing part 46 includes a pair of first cams 46a and a bail 46b. The bail 46b includes a horizontal bar portion 46c, and a pair of second cams 46d that are bent at right angle and extend in a rotation radial direction from both ends of the horizontal bar portion 46c.

The first cams 46a are, as shown in FIG. 6A, provided with insertion slits 46j for inserting therein the bail 46b from the top end side. In addition, these first cams 46a are provided with shaft holes 46e and rivet holes 46r arranged along the rotation radial direction. Additionally, the bottom end portions of these first cams 46a are provided with, as shown in FIG. 6A, first cam surfaces 46f to be abut against the pressed surface 43c of the elevating part 43 in a state where the elevating part 43 is moved up, and second cam surfaces 46h to be abut against the elevating part 43 in a state where the elevating part 43 is moved down. Further, the first cam surfaces 46f and the second cam surfaces 46h of these first cams 46a are provided with, as shown in FIG. 4, grooves 46i along a rotation direction. When the first cams 46a are rotated, the cam locking parts 43d of the elevating part 43 pass through the inside of the grooves 46i.

The second cams 46d of the bail 46b include short elongated holes 46k and long elongated holes 46m arranged along the rotation radial direction. As shown in FIG. 6A, in the tips of the second cams 46d, lock portions 47a having a steep angle and gentle-angled portions 47b having a gentle angle are continuously formed via curved surfaces. In this manner, when the tips of the second cams 46d abut against the elevating part 43 to move down the elevating part 43, the tips of the second cams 46d are not locked by the cam locking parts 43d, and the gentle-angled portions 47b move on the pressed surface 43c. However, when an attempt is made to rotate the tips of the second cams 46d in the opposite direction, the lock portions 47a are locked by the cam locking parts 43d, and thus it is possible to prevent the rotation.

When assembling the pressing part 46, first, bail springs 46n are fit into the long elongated holes 46m. On this occasion, the bail springs 46n are fit so as to abut against tip-side end portions of the long elongated holes 46m. Then, after inserting the second cams 46d into the insertion slits 46j of the first cams 46a, rivets 46p are inserted into the rivet holes 46r of the first cams 46a and the long elongated holes 46m of the second cams 46d. In this manner, the first cams 46a are mounted to the bail 46b.

Next, the first cams 46a are inserted into the pressing part insertion holes 41f of the cover body 41, the camshafts 46g are put in from the camshaft holes 41g on both front and back side surfaces of this cover body 41 to be inserted into the shaft holes 46e of the first cams 46a and the short elongated holes 46k of the second cams 46d. In this manner, the first cams 46a and the second cams 46d are rotatably supported by the cover body 41, and it is possible to pull the second cams 46d in the rotation radial direction against the biasing force of the bail springs 46n.

Subsequently, a description is given of a usage method of the IC socket 10 in accordance with this embodiment 1.

First, as shown in FIG. 7A etc., the IC package 13 is housed in the housing portion 28b provided in the contact module 24 of the socket body 11.

Then, the cover member 12 is installed on this socket body 11. On this occasion, by inserting the guide pins 41h of the cover member into the bushings 21b of the base part 21, the socket body 11 is positioned with the cover member 12.

Further, as shown in FIG. 7B, the engaging claws 45d of the latches 45 provided to the cover member 12 are engaged with the engaging concave portions 21a (see FIG. 7A etc.) provided to the base part 21 of the socket body 11. On this occasion, the first cams 46a of the pressing part 46 abut against the pressed surface 43c of the elevating part 43 at the first cam surface 46f (see FIG. 6A). Additionally, on this occasion, as shown in FIG. 6A, the elevating part 43 is at the highest position due to the biasing force of the springs 41d. Thus, a bottom surface of the heatsink 42 is not pressed against the upper surface of the IC package 13.

Figure 6B:
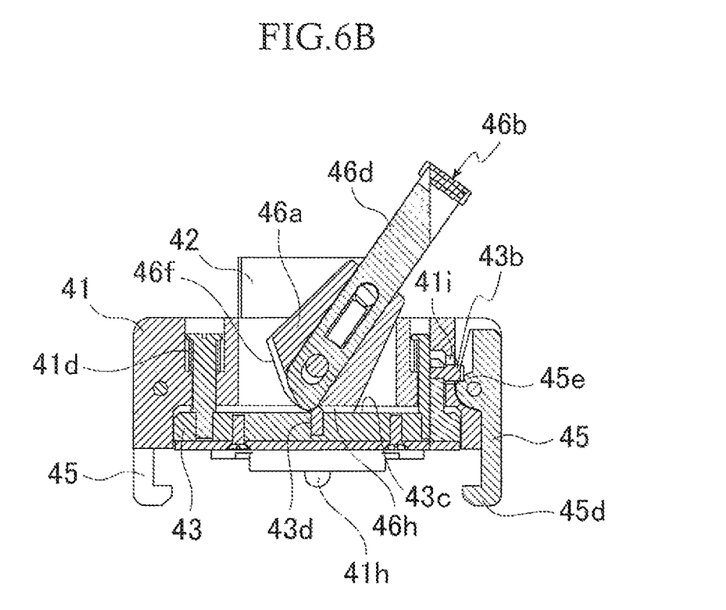
FIG. 6B is a cross-sectional view showing the configurations of the elevating mechanism and the latch mechanism of the socket for electrical component in accordance with the embodiment 1.

Thereafter, as shown in FIG. 7C, the bail 46b of the pressing part 46 is rotated from the left side to the right side in FIG. 7C. As described above, the shapes of the tips of the second cams 46d are formed such that the tips of the second cams 46d move on the pressed surface 43c without being locked by the cam locking parts 43d. Therefore, as shown in FIG. 6B, the second cams 46d can be rotated in accordance with the rotation of the bail 46b. In this manner, the first cams 46a are rotated in accordance with the rotation of the second cams 46d, and press the pressed surface 43c of the elevating part 43 in the down direction. Consequently, the elevating part 43 is moved down against the biasing force of the springs 41d, and the bottom surface of the heatsink 42 is pressed against the upper surface of the IC package 13. In this manner, the IC package 13 is fixed to the housing portion 28b. As described above, in this embodiment, the elevating part 43 is biased upwardly by the springs 41d provided in the cover body 41 (see FIG. 4, FIGS. 6A to 6C), and further, the heatsink 42 is biased downwardly by the springs 42f provided in the elevating part 43 (see FIG. 4, FIG. 5). Thus, it is possible to appropriately set the pressing force of the heatsink 42 with respect to the IC package 13.

Then, when the bail 46b is rotated to a predetermined position, the second cams 46d climb over the cam locking parts 43d, and the second cam surfaces 46h of the first cams 46a abut against the pressed surface 43c of the elevating part 43.

Additionally, on this occasion, since the elevating part 43 is moved down, the latch locking parts 43b descend within the elongated holes 41i of the cover body 41 to be engaged with the locking concave portions 45e of the latches 45. In this manner, the latches 45 are prevented from being rotated in the opening direction, and consequently, the cover member 12 cannot be removed from the socket body 11.

As described above, the shapes of the tips of the second cams 46d are formed such that the tips of the second cams 46d are engaged with the cam locking parts 43d, and the rotation in the opposite direction cannot be made. Thus, once the second cams 46d climb over the cam locking parts 43d, the first cams 46a also cannot be rotated in the opposite direction. Thus, IC socket 10 is locked in a state where the heatsink 42 is pressed against the IC package 13, and the engaging claws 45d of the latches 45 are engaged with the engaging concave portions 21a of the socket body 11.

Figure 6C:
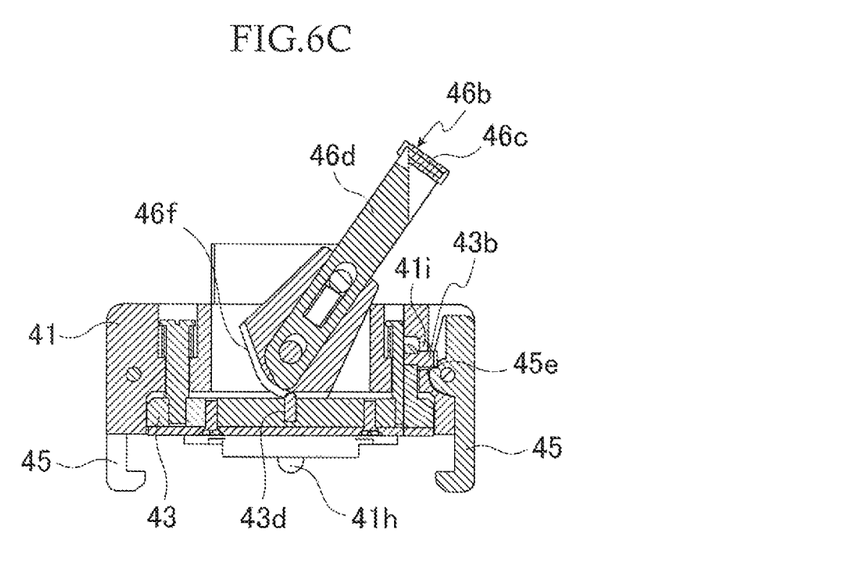
FIG. 6C is a cross-sectional view showing the configurations of the elevating mechanism and the latch mechanism of the socket for electrical component in accordance with the embodiment 1.

On the other hand, when unlocking this lock, first, as shown in FIG. 6C, the horizontal bar portion 46c of the bail 46b is pulled up in a direction away from the elevating part 43. In this manner, because the tips of the second cams 46d are moved to be above the cam locking parts 43d, it is possible to rotate the second cams 46d in the opposite direction, that is, the left direction in FIG. 6C. Then, when the bail 46b is rotated in the opposite direction, and the tips of the second cams 46d climb over the cam locking parts 43d, the elevating part 43 is moved up to the highest position due to the biasing force of the springs 41d. In this manner, the heatsink 42 is moved up and separated from the IC package 13, and the engagement between the locking concave portions 45e of the latches 45 and the latch locking parts 43b of the elevating part 43 is released. Consequently, it is possible to remove the cover member 12 from the socket body 11 by releasing the engagement between the engaging claws 45d and the engaging concave portions 21a of the socket body 11.

As explained above, according to this embodiment 1, the IC package 13 is pressed by the heatsink 42 with the use of the pressing part 46, thereby fixing the IC package 13 to the housing portion 28b of the socket body 11. Accordingly, it is possible to make the heatsink 42 dissipate heat from the IC package 13. Thus, it is possible to obtain excellent heat dissipation effect with respect to the IC package 13.

Additionally, according to this embodiment 1, the structure is employed where the first cam 46a and the second cam 46d are provided in the vicinity of each of both front and back side surfaces of the cover body 41, and the second cams 46d are connected to each other by a horizontal bar portion 46c. Accordingly, it is possible to arrange the heatsink 42 in the middle portion, and to arrange the pressing part 46 on both sides thereof. Thus, it is possible to increase the size of the heatsink 42, and thus to improve the heat dissipation.

Additionally, it is possible to perform fixing and releasing of the fixing of the IC package 13 with the heatsink 42 by operating this horizontal bar portion 46c. Thus, even though the heatsink 42 is arranged in the cover body 41 to penetrate therethrough, the operations of pressing and releasing of the pressing are easy.

Additionally, according to this embodiment 1, the structure is employed where the heatsink 42 is supported by the elevating part 43. Accordingly, by moving down this elevating part 43 by the pressing part 46, it is possible to press the heatsink 42 against the IC package 13.

Additionally, according to this embodiment 1, the pressing part 46 is fixed to the cover body 41 via the springs 41d, and the heatsink 42 is fixed to the pressing part 46 via the springs 42f. Accordingly, it is possible to appropriately set the pressing force of the heatsink 42 with respect to the IC package 13.

Note that, in this embodiment 1, the present invention is applied to the IC socket 10 as a socket for electrical component. However, this is not the limitation, and the present invention may be applied to other things.

REFERENCE SIGNS LIST

10 IC socket
11 socket body
12 cover member
13 IC package
21 base part
21a engaging concave portion
22 bottom plate
23 insulating plate
24 contact module
41 cover body
42 heatsink
43 elevating part
43b latch locking part
43d cam locking part
44 back plate
45 latch
45e locking concave portion
46 pressing part
46a first cam
46b bail
46c horizontal bar portion
46d second cam
46k short elongated hole
46m long elongated hole
46n bail spring

The invention claimed is:
1. A socket for electrical component, comprising:
a socket body in which an electrical component is housed in a housing portion provided in an upper surface side;
a contact pin to be electrically connected to the electrical component;
a cover member removably provided to the socket body and covering the housing portion of the socket body, wherein the cover member includes:
a frame-like cover body that is placed on an upper side outer edge portion of the socket body, the frame-like cover body including an opening in a middle portion thereof,
an elevating part provided to the frame-like cover body, the elevating part being moveable,
a heatsink that is provided to penetrate through the opening of the frame-like cover body, supported by the elevating part, and perform heat dissipation for the electrical component, and a pressing part that is supported by the frame-like cover body, the pressing part being moveable so as to press the heatsink against the electrical component and the pressing part including a pressing mechanism that is supported by the frame-like cover body to be rotatable to press a flat-shaped surface of the elevating part in a downward direction, wherein the pressing mechanism of the pressing part includes:

a first flat-shaped contact surface that contacts with the flat-shaped surface in a state where the elevating part is moved up, and a second flat-shaped contact surface that contacts with the flat-shaped surface in a state where the elevating part is moved down, wherein the first flat-shaped contact surface and the second flat-shaped contact surface have grooves along a rotation direction of the pressing part.

2. The socket for electrical component according to claim 1, wherein the pressing part is rotated along the rotation direction, a portion of the elevating part passes through the grooves.

3. The socket for electrical component according to claim 1, wherein the pressing part includes a pair of pressing mechanisms and a horizontal bar, the pair of pressing mechanisms are provided to a pair of opposing sides of the frame-like cover body, respectively, and the horizontal bar connects the pair of pressing mechanisms to each other.

4. The socket for electrical component according to claim 1, wherein the elevating part is biased upward by a first spring provided to the frame-like cover body, and the heatsink is biased downward by a second spring provided to the elevating part.

5. The socket for electrical component according to claim 1, wherein a pressing force to press the heatsink against the electrical component is set according to the elevating part that is biased upward while the heatsink is biased downward.

* * * * *